(12) United States Patent
Oh et al.

(10) Patent No.: US 10,668,403 B2
(45) Date of Patent: Jun. 2, 2020

(54) SOURCE SUPPLIER FOR A SUPERCRITICAL FLUID, SUBSTRATE PROCESSING APPARATUS HAVING THE SAME

(71) Applicant: SAMSUNG ELECTRONICS CO., LTD., Suwon-si, Gyeonggi-Do (KR)

(72) Inventors: Jung-Min Oh, Incheon (KR); Ji-Hoon Jeong, Suwon-si (KR); Dong-Gyun Han, Yongin-si (KR); Kun-Tack Lee, Suwon-si (KR); Hyo-San Lee, Hwaseong-si (KR); Yong-Myung Jun, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 592 days.

(21) Appl. No.: 15/482,549

(22) Filed: Apr. 7, 2017

(65) Prior Publication Data
US 2018/0028936 A1 Feb. 1, 2018

(30) Foreign Application Priority Data

Jul. 29, 2016 (KR) .................. 10-2016-0097570

(51) Int. Cl.
*B01D 53/02* (2006.01)
*B01D 11/04* (2006.01)
(Continued)

(52) U.S. Cl.
CPC ...... *B01D 11/0407* (2013.01); *B01D 11/0411* (2013.01); *G01N 21/3554* (2013.01);
(Continued)

(58) Field of Classification Search
CPC ............ B01D 11/0203; B01D 11/0403; B01D 11/0407; B01D 11/0411; G01N 21/3554;
(Continued)

(56) References Cited

U.S. PATENT DOCUMENTS 6,395,064 B1 * 5/2002 Xu ........................... B01D 3/06
95/15
7,064,834 B2 6/2006 Johnson et al.
(Continued)

FOREIGN PATENT DOCUMENTS

JP 2005-517623 6/2005
JP 2013-087017 5/2013
(Continued)

*Primary Examiner* — Christopher P Jones
(74) *Attorney, Agent, or Firm* — F. Chau & Associates, LLC

(57) ABSTRACT

A source supplier includes a source reservoir that contains a liquefied source fluid for a supercritical process, a vaporizer that vaporizes the liquefied source fluid into a gaseous source fluid under high pressure, a purifier that removes organic impurities and moistures from the gaseous source fluid and an analyzer connected to the purifier that analyzes an impurity fraction and a moisture fraction in the gaseous source fluid. Moisture and organic impurities are removed from the source fluid to reduce the moisture concentration of the supercritical fluid in the supercritical process.

17 Claims, 8 Drawing Sheets

(51) Int. Cl.
*G01N 21/3554* (2014.01)
*H01L 21/67* (2006.01)
*H01L 21/02* (2006.01)
*B01D 11/02* (2006.01)

(52) U.S. Cl.
CPC .... *H01L 21/67017* (2013.01); *H01L 21/6719* (2013.01); *H01L 21/67028* (2013.01); *H01L 21/67034* (2013.01); *H01L 21/67109* (2013.01); *B01D 11/0203* (2013.01); *B01D 11/0403* (2013.01); *H01L 21/02101* (2013.01)

(58) Field of Classification Search
CPC ......... H01L 21/02101; H01L 21/67017; H01L 21/67028; H01L 21/67034; H01L 21/67109; H01L 21/6719
See application file for complete search history.

(56) References Cited

U.S. PATENT DOCUMENTS

| | | |
|---|---|---|
| 7,556,671 B2 | 7/2009 | Jain et al. |
| 8,702,845 B2 | 4/2014 | Stallmann |
| 9,050,555 B2 | 6/2015 | Iijima |
| 2003/0118476 A1* | 6/2003 | Fujii ................ H01L 21/67017 422/40 |
| 2004/0168742 A1* | 9/2004 | Kim .................. H01L 21/67017 141/98 |
| 2013/0118735 A1 | 5/2013 | Jamal et al. |
| 2015/0170939 A1* | 6/2015 | Rebstock .............. B08B 9/0321 137/15.04 |
| 2016/0003532 A1 | 1/2016 | Young et al. |
| 2016/0067651 A1 | 3/2016 | Naito |
| 2016/0069612 A1 | 3/2016 | Conway et al. |
| 2016/0273906 A1 | 9/2016 | Pisarenco et al. |

FOREIGN PATENT DOCUMENTS

| | | |
|---|---|---|
| JP | 2014-113539 | 6/2014 |
| KR | 10-2010-0130805 | 12/2010 |
| KR | 10-2011-0066681 | 6/2011 |
| KR | 10-1045643 | 7/2011 |

* cited by examiner

SOURCE SUPPLIER FOR A SUPERCRITICAL FLUID, SUBSTRATE PROCESSING APPARATUS HAVING THE SAME

CROSS-REFERENCE TO RELATED APPLICATIONS

This application claims priority under 35 U.S.C. § 119 from, and the benefit of, Korean Patent Application No. 10-2016-0097570, filed on Jul. 29, 2016 in the Korean Intellectual Property Office, the contents of which are herein incorporated by reference in their entirety.

BACKGROUND

1. Technical Field

Exemplary embodiments relate to a source supplier for a supercritical fluid, a substrate processing apparatus having the same and a method of processing substrates in the substrate processing apparatus.

2. Description of the Related Art

A wet process for a semiconductor device such as a wet cleaning process or a wet etching process may require a drying process to remove chemicals used in the wet process. As design rules of semiconductor devices have been reduced, fine patterns on a substrate may frequently partially or completely collapse, and make contact with neighboring patterns, an effect known as a bridge defect, in a dry process.

Supercritical fluids, which can simultaneously behave like a gas and liquid, may be used in a drying process, hereinafter, referred to as a supercritical drying process, to prevent pattern collapses and bridge defects. A supercritical fluid can, like a gas, diffuse through a solid and can, like a liquid, simultaneously dissolve materials, without the surface tension of the liquid, and wet process chemicals can easily diffuse or dissolve in a supercritical fluid in a drying process. In particular, carbon dioxide ($CO_2$) has been widely used as a supercritical fluid in drying processes because the critical point (31.1° C. & 7.38 MPa) of $CO_2$ is lower than many other material.

In a conventional supercritical fluid supplier, liquefied $CO_2$ is at first purified into a high purity liquefied $CO_2$ in a purifier and the high purity liquefied $CO_2$ is transformed into a supercritical state in a supercritical generator. Then, the high purity supercritical $CO_2$ is supplied to a substrate treating apparatus.

However, moistures is not effectively removed from liquefied $CO_2$ by the purifier in a conventional supercritical fluid supplier, so pattern collapses and bridge defects still frequently occur in supercritical drying processes. In addition, the moisture fraction of the liquefied $CO_2$ or the supercritical $CO_2$ needs to be detected in real time for accurate moisture control in the supercritical fluid supplier.

SUMMARY

Exemplary embodiments of the present inventive concept can provide a supercritical fluid supplier having a moisture filter and a moisture analyzer for an accurate moisture control.

Other exemplary embodiments of the present inventive concept can provide a substrate treating apparatus having the above supercritical fluid supplier.

According to exemplary embodiments of the inventive concept, there is provided a source supplier for supplying a source fluid to a supercritical fluid generator in which the source fluid is under a supercritical state. The source supplier includes a source reservoir that contains a liquefied source fluid for a supercritical process, a vaporizer that vaporizes the liquefied source fluid into a gaseous source fluid under high pressure, a purifier that removes organic impurities and moisture from the gaseous source fluid, and an analyzer connected to the purifier that analyzes an impurity fraction and a moisture fraction in the gaseous source fluid. According to other exemplary embodiments of the inventive concept, there is provided a substrate processing apparatus that uses a supercritical fluid (SCF) as a process fluid. The substrate processing apparatus includes a process chamber that performs a supercritical process on the substrate using the SCF, a SCF generator that generates the SCF and supplies the SCF to the process chamber, and a source supplier that supplies a source fluid to the SCF generator. The source supplier includes a source reservoir that contains a liquefied source fluid for a supercritical process, a vaporizer that vaporizes the liquefied source fluid into a gaseous source fluid under high pressure, a purifier that removes organic impurities and moisture from the gaseous source fluid, and an analyzer connected to the purifier that analyzes an impurity fraction and a moisture fraction in the gaseous source fluid. According to other exemplary embodiments of the inventive concept, there is provided a source supplier for supplying a source fluid to a supercritical fluid generator in which the source fluid is under a supercritical state. The source supplier includes a purifier that removes organic impurities and moisture from a gaseous source fluid, wherein the purifier includes a first filter that filters the organic impurities from the gaseous source fluid, wherein an impurity-filtered source fluid is formed, and a second filter that filters moisture from the impurity-filtered source fluid, wherein a dehydrated source fluid is formed; and an analyzer connected to the purifier that analyzes an impurity fraction and a moisture fraction in the gaseous source fluid, wherein the analyzer includes an impurity detector that detects organic impurities in the impurity-filtered source fluid and a moisture detector that detects moisture in the dehydrated source fluid.

According to exemplary embodiments of the present inventive concept, moisture as well as organic impurities can be removed from a gaseous source fluid and the moisture concentration of a supercritical fluid can be reduced in a supercritical process. Thus, process defects, such as leaning defects and bridge defects, can be prevented in a supercritical process.

DETAILED DESCRIPTION OF EXEMPLARY EMBODIMENTS

Figure 1:
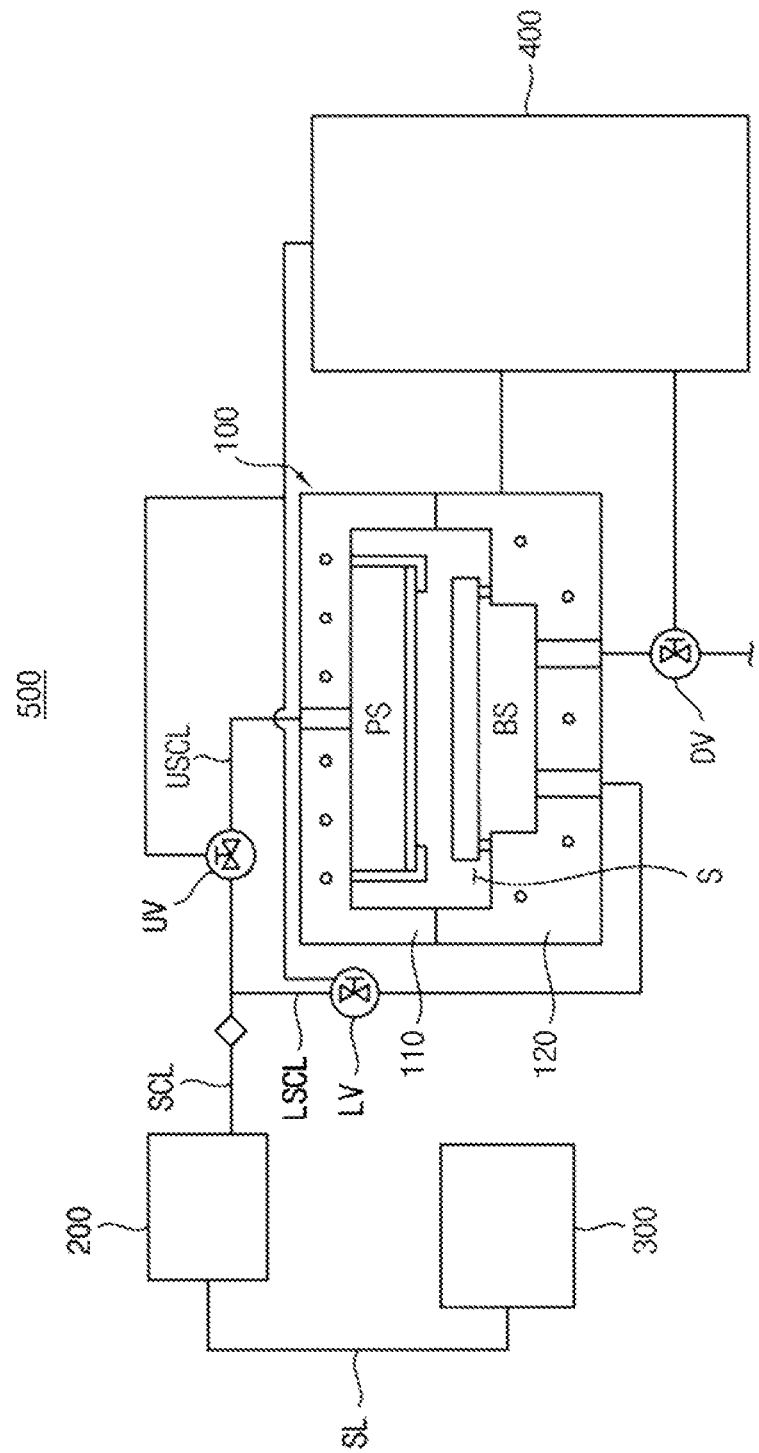
FIG. 1 is a structural view of a substrate treating apparatus in accordance with an exemplary embodiment.

Reference will now be made to exemplary embodiments, which are illustrated in the accompanying drawings, wherein like reference numerals may refer to like components throughout.

Figure 2:
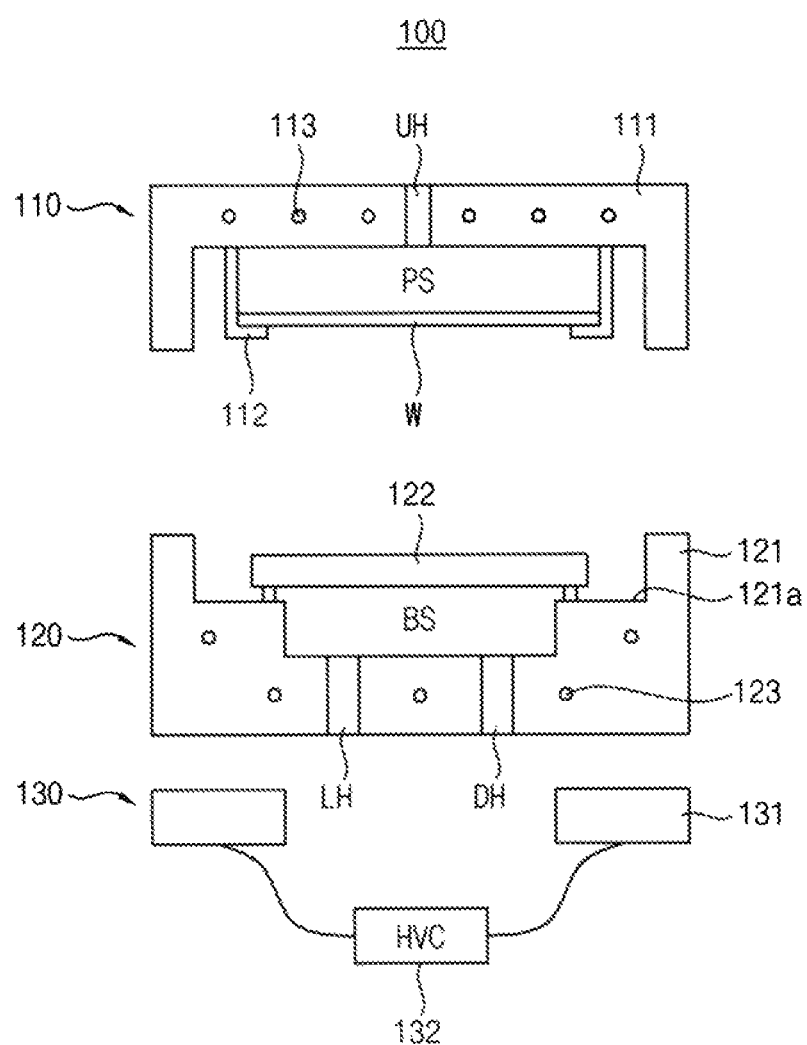
FIG. 2 is a structural view of a process chamber of the substrate treating apparatus shown in FIG. 1.
Figure 3:
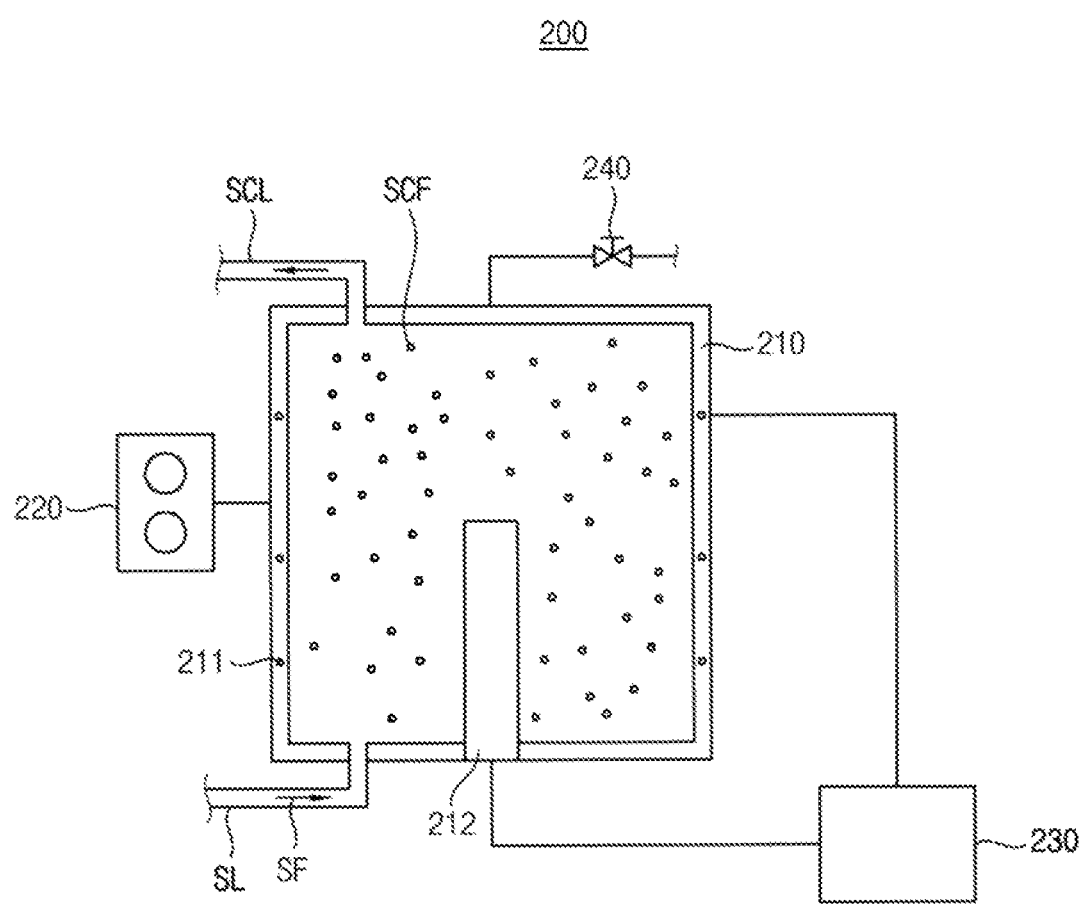
FIG. 3 is a structural view of a supercritical fluid generator of the substrate treating apparatus shown in FIG. 1.
Figure 4:
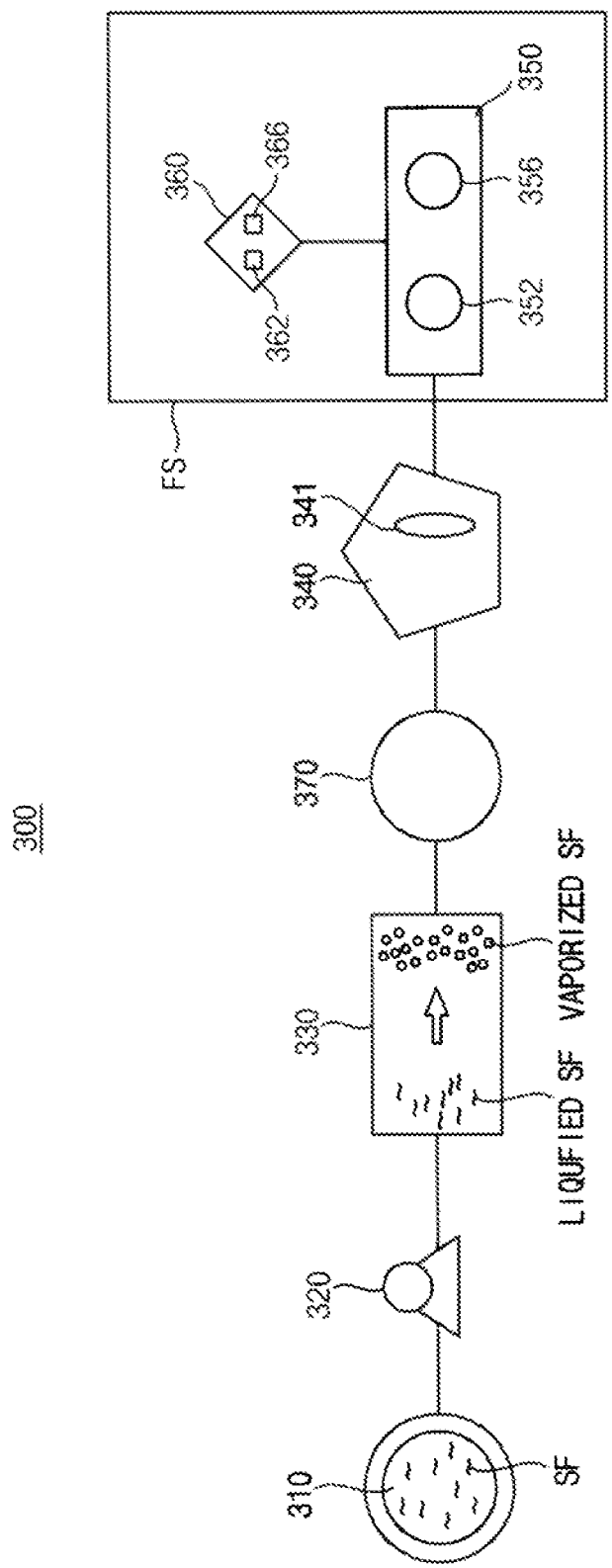
FIG. 4 is a structural view of a supercritical fluid supplier of the substrate treating apparatus shown in FIG. 1.

FIG. 1 is a structural view of a substrate treating apparatus in accordance with an exemplary embodiment. FIG. 2 is a structural view of a process chamber of the substrate treating apparatus shown in FIG. 1 and FIG. 3 is a structural view of a supercritical fluid generator of the substrate treating apparatus shown in FIG. 1. FIG. 4 is a structural view of a supercritical fluid supplier of the substrate treating apparatus shown in FIG. 1.

Referring to FIGS. 1 to 4, according to an embodiment, an apparatus 500 for processing substrates, hereinafter, referred to as a substrate processing apparatus, includes a process chamber 100 that can perform a supercritical process on a substrate using a supercritical fluid (SCF) that is a process fluid in a supercritical state, an SCF generator 200 that can generate the SCF and supply the SCF to the process chamber 100, a source supplier 300 that can supply a gaseous source fluid to the SCF generator 200, and a controller 400 that controls the process chamber 100.

According to an embodiment, the process chamber 100 includes an upper chamber 110 having a substrate holder 112, a lower chamber 120 having a blocking plate 122 and a buffer space BS between the blocking plate 122 and a lower portion thereof, and a chamber driver 130 that combines the upper chamber 110 and the lower chamber 120 so that the insides of the upper chamber 110 and the lower chamber 120 form a sealed inner space S of the process chamber 100.

According to an embodiment, the upper chamber 110 includes an upper body 111 shaped as a three-dimensional recessed solid and secured in a preset position, and the substrate holder 112 is arranged at a top portion thereof. The substrate holder 112 includes a horizontal bar on which a substrate W can be positioned and vertical bars extending upward from the horizontal bar and secured to a ceiling of the upper body 111. The substrate holder 112 can move vertically upwards and downwards. The substrate W can be held by the substrate holder 112 so that a rear surface of the substrate W makes contact with the horizontal bar and a side surface of the substrate W makes contact with the vertical bars.

In a present exemplary embodiment, the substrate holder 112 includes a compressive resin, and deformation of the substrate holder 112 can be minimized in a supercritical fluid. For example, the substrate holder 112 includes a fluoride-based resin such as polyether ether ketone (PEEK) or polyimide (PI), and the substrate W can be stably and correctly positioned in the process chamber 100 under a supercritical state.

According to an embodiment, an upper hole UH is provided in the upper portion of the upper chamber 110 and an upper path line USCL is connected to the upper hole UH.

A plurality of upper heaters 113 are provided in the upper body 111 that can heat the upper chamber 110.

According to an embodiment, the lower chamber 120 can be displaced upwards and downwards by the chamber driver 130, and the lower chamber 120 can be detachably combined to the upper chamber 110.

According to an embodiment, the lower chamber 120 includes a lower body 121 shaped as a three-dimensional recessed solid with a recessed portion that functions as the buffer space BS and the blocking plate 122 covering the buffer space BS. The upper chamber 110 and the lower chamber 120 are combined with each other to from the process chamber 100. The recessed portion inside the chambers 110 and 120 forms the inner space S of the process chamber 100.

In a present exemplary embodiment, the buffer space BS is provided in a bottom recess and the blocking plate 122 is shaped as a disk plate that can be spaced apart from the bottom surface and covers the buffer space BS.

According to an embodiment, a lower hole LH and a discharge hole DH are provided in the lower body 121 so that the buffer space BS can communicate with the lower hole LH and the discharge hole DH. A lower path line LSCL can be connected to the lower hole LH, so that supercritical fluid can be supplied to the buffer space BS through the lower hole LH, and supercritical mixtures or byproducts of the supercritical process can be discharged from the process chamber 100 through the discharge hole DH. A discharge line can be connected to the discharge hole DH and the flow of the supercritical mixtures can be controlled by a discharge valve DV.

According to an embodiment, a plurality of lower heaters 123 are provided in the lower body 121 that can heat the lower chamber 120. A plurality of joints protrude from a peripheral portion of the lower body 121 that can be inserted into a joint hole of the upper body 111 to combine the upper body 111 with the lower body 121.

According to an embodiment, when a supercritical fluid is directly supplied to the substrate W, the substrate W and fine patterns on the substrate W may be damaged by the supercritical fluid. For that reason, the blocking plate 122 can block the flow path of the supercritical fluid to protect the substrate W from direct injection of the supercritical fluid. The flow path of the supercritical fluid is changed from a vertical direction to a horizontal direction by the blocking plate 122, and horizontally flows into the inner space S of the process chamber 100 via gaps between a bottom surface 121a of the lower body 121 and the blocking plate 122. The substrate W can be protected from a direct injection of a supercritical fluid.

According to an embodiment, although ice particles can be generated in the buffer space BS due to, for example, adiabatic expansion of the supercritical fluid at an initial time when the supercritical fluid is supplied into the buffer space BS, the ice particles settle in the buffer space BS and are prevented from being deposited on the substrate W in the inner space S of the process chamber 100. Thus, the substrate W can be protected from ice particles at the initial time of the process.

According to an embodiment, the chamber driver 130 can be connected to the lower chamber 120 and can displace the lower chamber 120 to combine with the upper chamber 110 or to separate from the upper chamber 110. For example, the chamber driver 130 includes a hydraulic cylinder 131 that is connected to the lower body 121 that transfers hydraulic pressure upwards or downwards to the lower chamber 110, and a hydraulic controller 132 that controls the hydraulic pressure of the hydraulic cylinder 131.

In a present exemplary embodiment, the process chamber 10 includes stainless steel with an allowable pressure of about 300 bar and an allowable temperature of about 150° C., and the chamber driver 130 combines the lower chamber 120 with the upper chamber 110 by a compressive force of over about 300 bar.

According to an embodiment, the supercritical process performed in the process chamber 100 using a supercritical fluid can include various unit processes for manufacturing semiconductor devices. For example, the supercritical process may include a wet etching process that uses the supercritical fluid as an etchant, a cleaning process that uses the supercritical fluid as a cleaning solution, and a drying process that uses the supercritical fluid as a dry solvent. Thus, a supercritical fluid can be selected based on the unit processes performed in the process chamber 100.

According to an embodiment, when a substrate W that includes fine patterns having a high aspect ratio of about 10 to about 50 undergoes a cleaning process using organic chemicals, the substrate W is loaded into the process chamber 100 and a drying process is performed on the substrate W using the supercritical fluid in the process chamber 100 without causing substantial damage to the high aspect ratio patterns.

According to an embodiment, a supercritical fluid is supplied into the process chamber 100 together with various additives, such as a surfactant, and chemicals or impurities can be removed from the substrate W by substituting a solvent with the supercritical fluid. The substrate W can be treated in a supercritical process without damaging the high aspect ratio patterns on the substrate W. The process fluid changes into a supercritical fluid when the temperature and pressure of the process fluid rise above the critical point thereof. A supercritical fluid diffuses through solids like a gas and dissolves materials like a liquid. A process fluid for a supercritical fluid varies depending the chemicals or impurities that need to be removed from the substrate W.

For examples, organic chemicals to be removed from the substrate include ethyl glycol, propanol, tetra hydraulic franc, 4-hydroxyl, 4-methyl, 2-pentanone, 1-butanol, 2-butanol, methanol, ethanol, n-propyl alcohol, dimethylether, and combinations thereof. A process fluid that removes organic chemicals from the substrate W may include carbon dioxide ($CO_2$), pure water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), and combinations thereof. In a present exemplary embodiment, carbon dioxide ($CO_2$) is used as the supercritical fluid.

In an exemplary embodiment, the SCF generator 200 generates a supercritical fluid from a source fluid SF and supplies the SCF into the process chamber 100. The SCF generator 200 include a supercritical reservoir 210 in which the supercritical fluid is stored, built-in heaters 211 and 212, a state sensor 220 that can detect an inner temperature and an inner pressure of the supercritical reservoir 210, and a power supplier 230 that can supply electric power to the built-in heaters 211 and 212.

According to an embodiment, the supercritical reservoir 210 includes a steel cylinder that is sufficient thick and rigid for a supercritical state. A first built-in heater 211 is provided in the steel cylinder and a second built-in heater 212 protrudes into a space of the steel cylinder from a bottom thereof. The first and the second built-in heater 211 and 212 are operated by the power supplier 230.

According to an embodiment, the source fluid SF flows into the supercritical reservoir 210 via a source line SL at a pressure above the supercritical pressure of the source fluid SF and is heated to a temperature above the supercritical temperature of the source fluid SF by the built-in heaters 211 and 212. Thus, the source fluid SF changes into a supercritical fluid SCF in the supercritical reservoir 210. The temperature and the pressure in the supercritical reservoir 210 can be detected by the state sensor 220, which includes a temperature sensor and a pressure sensor, and the supercritical state can be maintained in the supercritical reservoir 210. When the pressure of the supercritical reservoir 210 becomes higher than the allowable pressure, the relief valve 240 automatically operates to discharge the supercritical fluid from the supercritical reservoir 210 and reduce the pressure of the supercritical reservoir 210.

According to an embodiment, the supercritical fluid SCF in the supercritical reservoir 210 flows into the process chamber 100 through the supercritical line SCL connected to the upper hole UH of the upper chamber 110.

According to an embodiment, the supercritical line SCL includes an upper line USCL connected to an upper portion of the process chamber 100 and a lower line LSCL connected to a lower portion of the process chamber 100. Thus, supercritical fluid SCF can be supplied to an upper portion of the process chamber 100 and to the lower portion of the process chamber 100. The flow of the supercritical fluid SCL via the upper line USCL can be controlled by an upper valve UV and the flow of the supercritical fluid SCL via the lower line LSCL can be controlled by a lower valve LV.

In a present exemplary embodiment, the supercritical fluid SCF flows into the buffer space BS of the lower chamber 120 through the lower line LSCL at the start of the supercritical process until the pressure gradient in the process chamber 100 decreases to within an allowable range, and then the supercritical fluid SCF flows through the upper line USCL together with the lower line LSCL. Thus, the time needed to supply the supercritical fluid SCF can be reduced by using both the upper and lower lines USCL and LSCL.

According to an embodiment, ice particles, which can be generated by adiabatic expansion of the supercritical fluid SCL at the start of the supercritical process, condense on sidewalls of the buffer space BS and can be prevented from directly depositing onto the substrate W in the inner space S of the process chamber 100. Thus, the substrate W can be protected from the ice particles. In addition, since the blocking plate 122 can prevent the supercritical fluid SCF from being directly injected onto the substrate W, high aspect ratio patterns on the substrate W can be prevented from collapsing due to, for example, the high pressure supercritical fluid.

According to an embodiment, when the pressure gradient between the inner pressure of the process chamber 100 and the pressure of the supercritical fluid is sufficiently small, the supercritical fluid SCF is directly injected onto the substrate W through the upper line USCL without substantially collapsing the high aspect ratio patterns. The high aspect ratio patterns are arranged on a front surface of the substrate W and the substrate W can be positioned on the substrate holder 112 such that the rear surface makes contact with the horizontal bar of the substrate holder 112. Thus, a supercritical process can be performed on the substrate W in a process space PS between the ceiling of the upper chamber 110 and the front surface of the substrate W.

Therefore, according to an embodiment, the supercritical fluid SCF can be supplied into the buffer space BS through the lower line LSCL at the start of the supercritical process, and can be supplied into both of the buffer space BS and the process space PS through both the upper line USCL and the lower line LSCL at a time when the pressure gradient between the inner pressure of the process chamber 100 and the pressure of the supercritical fluid SCF is sufficiently small.

In modified exemplary embodiments, various instruments can be installed on the supercritical line SCL. For example, a supercritical filter, a line temperature sensor, and a line pressure sensor can be installed on the supercritical line SCL.

According to an embodiment, the supercritical filter removes impurities or contaminants from the supercritical fluid SCF before the supercritical fluid flows into the process chamber 100, thus higher purity supercritical fluid SCF can be supplied into the process chamber 100. The line temperature sensor and the line pressure sensor can detect the temperature and pressure of the supercritical fluid SCF in the supercritical line SCL. The temperature and pressure of the supercritical fluid SCF can decrease while flowing through the supercritical line SCL, so the fluid in the supercritical line SCL can deviate from a supercritical state. When the line temperature sensor and the line pressure sensor indicate that the temperature and pressure of the fluid in the supercritical line SCL deviate from a supercritical state, the fluid in the supercritical line SCL can be stopped from flowing into the process chamber 100.

According to an embodiment, the ice particles and the supercritical mixtures are discharged from the process chamber 100 through the discharge hole DH.

According to an embodiment, when a drying process that removes the chemicals in a rinsing process or a cleaning process is performed using the supercritical fluid SCF in the process chamber 100 reduces the concentration of chemicals dissolved in the supercritical fluid SCF below a reference concentration, the supercritical mixtures of the chemicals and the supercritical fluid SCF are discharged from the process chamber 100 through the discharge hole DH so that the inner pressure of the process chamber 100 gradually decreases to atmospheric pressure. In such a case, the mass flow of the supercritical mixtures is controlled by the discharge valve DV.

According to an embodiment, the upper valve UV the lower valve LV and the discharge valve DV can be systematically controlled by the controller 400, thereby increasing the process efficiency of a supercritical process in the process chamber 100. The upper valve UV, the lower valve LV and the discharge valve DV each include a valve assembly having a plurality of valves.

According to an embodiment, the source supplier 300 supplies the source fluid SF to the supercritical fluid generator 200 in a gaseous state from which impurities and moisture is substantially removed.

According to an embodiment, the source supplier 300 includes a source reservoir 310 that contains the liquefied source fluid SF for the supercritical process, a vaporizer 330 that vaporizes the liquefied source fluid SF into the gaseous state under a high pressure, a flow controller 340 that controls the flow of a gaseous source fluid exhausted from the vaporizer 330, a purifier 350 that filters organic impurities and moistures from the gaseous source fluid to form a purified source fluid, and an analyzer 360 that analyzes the moisture fraction in the purified source fluid.

According to an embodiment, the source reservoir 310 includes a storing cylinder or a storing tank that is sufficiently rigid and stiff and the source fluid SF is stored in the source reservoir 310 as a liquid state. Therefore, the configurations and the structures of the source reservoir 310 can vary based on the source fluid SF.

In a present exemplary embodiment, carbon dioxide ($CO_2$) is used as the supercritical fluid SCF, so liquefied $CO_2$ condensed under a pressure of about 15 bar to about 25 bar is contained in the source reservoir 310.

In particular, according to an embodiment, since the source reservoir 310 is structured as a high pressure vessel, the process chamber 100 and the supercritical fluid generator 200 are located relatively far from the source reservoir 310, and the source line SL is connected between the source reservoir 310 and the supercritical fluid generator 200. For example, the source reservoir 310 can be located at a high pressure security area far from the working area of the supercritical fluid generator 200 and the process chamber 100.

According to embodiments, various instruments can be further installed on the source line SL to detect and control the purity and state of the source fluid in the source line SL.

According to embodiments, the liquefied source fluid SF is pressurized by a transfer pump 320 and supplied to the vaporizer 330. The transfer pump 320 pumps the liquefied source fluid SF to flow to the vaporizer 330 and controls the supply of the liquefied source fluid SF based on the working state of the supercritical fluid generator 200. For example, the transfer pump 320 may include a variable delivery pump that varies transfer pressure and the transfer mass based on a distance between the source reservoir 310 and the vaporizer 330.

According to embodiments, the vaporizer 330 changes the state of the source fluid SF from a liquid state to a gas state. For example, the vaporizer 330 may include a heat exchanger that changes a liquid state to a gas state using high temperature water or vapor and at least one pressurizer to pressurize the gaseous source fluid SF. In particular, the pressurizer may include a plurality of pressure units connected in series and can stepwise increase the pressure of the gaseous source fluid SF. In a present exemplary embodiment, vaporizer 330 changes the liquefied source fluid SF into the gaseous source fluid SF under a pressure of about 30 bar to about 40 bar.

According to embodiments, the high pressure gaseous source fluid SF can be temporarily stored in the buffer reservoir 370 located near the supercritical fluid generator 200. The gaseous source fluid SF is supplied to the supercritical fluid generator 200 and the mass flow of the gaseous source fluid SF into the supercritical fluid generator 200 is controlled by the flow controller 340. Thus, when the mass flow of the gaseous source fluid SF flowing out of the vaporizer 330 is greater than the mass flow of the gaseous source fluid SF flowing into the supercritical fluid generator 200, the source fluid SF is temporarily stored in the buffer reservoir 370.

In particular, according to embodiments, an additional pressurizer can be provided with the buffer reservoir 370, and the source fluid SF in the buffer reservoir 370 can be pressurized to a pressure higher than achieved by the vaporizer 330. For example, the buffer reservoir 370 may pressurize the source fluid SF to a pressure of about 55 bar to about 60 bar.

According to embodiments, the flow controller 340 controls the mass flow of the source fluid SF into the supercritical fluid generator 200. For example, the flow controller 340 includes a gas regulator arranged at an outlet portion of the vaporizer 330 or the buffer reservoir 370 that controls the mass flow of the source fluid SF by generating a pressure gradient with respect to the supercritical fluid generator 200 at the outlet portion of the vaporizer 330 or the buffer reservoir 370.

In particular, according to embodiments, a subsidiary filter 341 is further provided in the flow controller 340 to further remove impurities from the source fluid SF while flowing through the flow controller 340. For example, the subsidiary filter 341 may include a nano filter that filters fine particles having a diameter of about 3 nm or more.

According to embodiments, the purifier 350 removes organic impurities and moisture from the gaseous source fluid SF to increase the purity of the source fluid SF prior to flowing into the SCF generator 200. In particular, the analyzer 360 is connected to the purifier 350 and detects organic impurities and moisture from the source fluid SF. In a present exemplary embodiment, the purifier 350 and the analyzer 360 are combined into a single filtering system FS.

According to an embodiment, the purifier 350 includes a first filter 352 that filters organic impurities from the gaseous source fluid SF and a second filter 356 that filters moisture from the gaseous source fluid SF. In addition, the analyzer 360 includes an impurity detector 362 that detects organic impurities in the source fluid SF and a moisture detector 366 that detects moisture in the source fluid SF.

Figure 5:
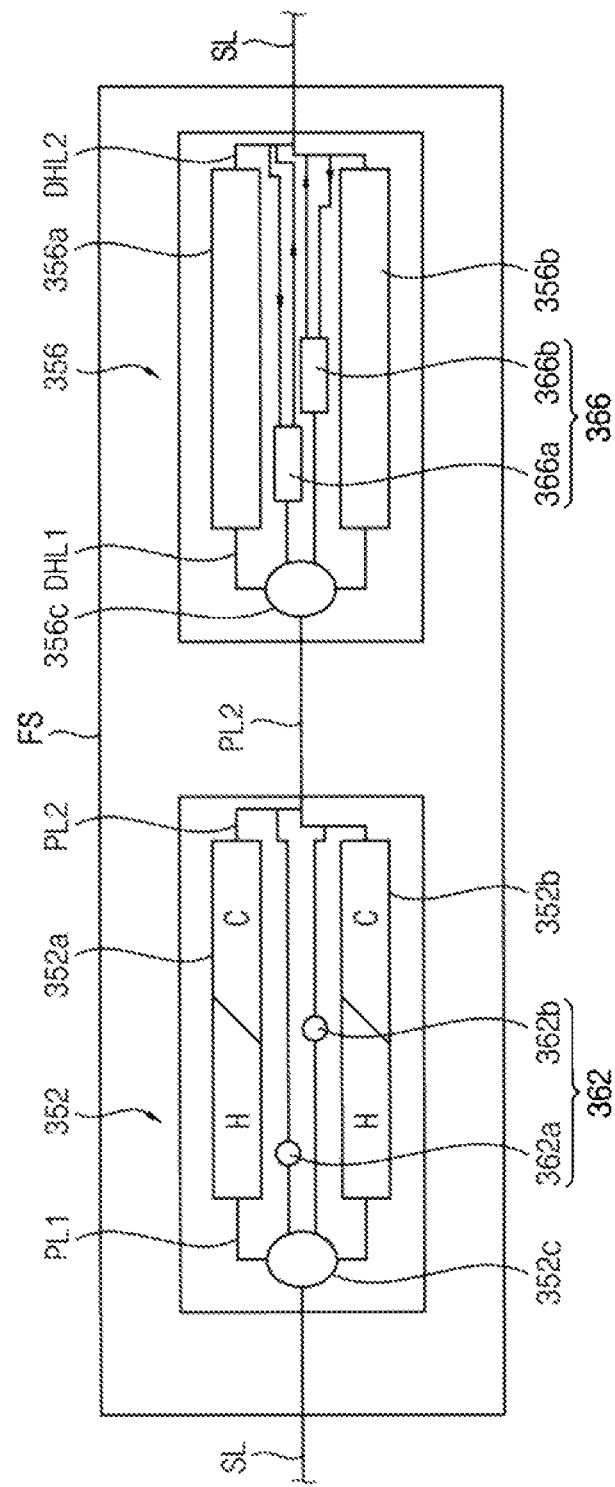
FIG. 5 is a structural view of the filtering system shown in FIG. 4 in accordance with an exemplary embodiment of the present inventive concept.

FIG. 5 is a structural view of the filtering system shown in FIG. 4 in accordance with an exemplary embodiment of the present inventive concept.

Referring to FIG. 5, according to an embodiment, the filtering system FS includes first and the second filters that are sequentially arranged in series on the source line SL and the impurity and moisture detectors 362 and 366 that are connected to the first and the second filters 352 and 356, respectively.

According to embodiments, the first filter 352 includes a pair of first and second purifying cylinders 352a and 352b each having a high-efficiency particulate arrestance (HEPA) filter H and a carbon filter C. The first and the second purifying cylinders 352a and 352b function complementary with each other and organic impurities are removed from the source fluid SF by one of the purifying cylinders 352a and 352b.

According to embodiments, the gaseous source fluid SF flows into the first filter 352 through the source line SL and is guided to one of the first and the second purifying cylinder 352a and 352b through a first purifying line PL1 by a first path selector 352c. For example, when one of the first and the second purifying cylinder 352a and 352b is not working or has malfunctioned, the first path selector 352c can detect the malfunction or abnormality and can guide the source fluid SF to the other normal, working purifying cylinder. Thus, impurities of the source fluid SF can be filtered from the source fluid SF irrespective of malfunctions of the purifying cylinders 352a and 352b, thereby preventing efficiency deterioration and reducing the maintenance cost of the first filter 352.

According to embodiments, organic impurities in the source fluid SF can be removed by the HEPA filter H and the carbon filter C, and the impurity-filtered source fluid SF flows out of the first filter 352 through the second purifying line PL2 connected to the second filter 356. The impurity-filtered source fluid SF flows into a dehydrating cylinder of the second filter 356 through a first dehydrating line DHL1.

According to embodiments, the impurity detector 362 is connected with the second purifying line PL2 and detects the concentration of impurities of the source fluid SF filtered by one of the first and the second purifying cylinders 352a and 352b. In a present exemplary embodiment, the impurity detector 362 includes a first impurity detector 362a connected to the first purifying cylinder 352a via the second purifying line PL2 and a second impurity detector 362b connected to the second purifying cylinder 352b via the second purifying line PL2.

According to embodiments, the first impurity detector 362a detects organic impurities in the source fluid SF discharged from the first purifying cylinder 352a that flows through the second purifying line PL2. In particular, the first impurity detector 362a is further connected to the first purifying line PL1 and detects organic impurities in the source fluid SF prior to the purifying process of the first purifying cylinder 352a, and compares the impurity concentration of the source fluid SF prior to flowing into the first purifying cylinder 352a with the impurity concentration of the source fluid SF after the purifying process in the first purifying cylinder 352a. Accordingly, the first impurity detector 362a can monitor purification performance of the first purifying cylinder 352a based on the comparison results of the impurity concentration.

In addition, according to embodiments, the second impurity detector 362b detects organic impurities in the source fluid SF discharged from the second purifying cylinder 352b that flows through the second purifying line PL2, and monitors purification performance of the second purifying cylinder 352b based on the comparison results of the impurity concentration in the same way as the first impurity detector 362a.

According to embodiments, when the purification performance of the first purifying cylinder 352a has deteriorated below an allowable reference value, the first path selector 352c closes the first purifying line PL1 to the first purifying cylinder 352a and opens the first purifying line PL1 to the second purifying cylinder 352b. Thus, the source fluid SF flows into the second purifying cylinder 352b and is blocked from flowing into the first purifying cylinder 352a. The first purifying cylinder 352a can be repaired while the source fluid SF is filtered in the second purifying cylinder 352b.

According to embodiments, the impurity-filtered source fluid SF flows from the first filter 352 into the second filter 356 that removes moisture via the second purifying line PL2.

According to embodiments, the impurity-filtered source fluid SF is guided into one of the first and the second dehydrating cylinder 356a and 356b through a first dehydrating line DHL1 by a second path selector 356c. Similar to structures of the first and second purifying cylinders 352a and 352b, when one of the first and the second dehydrating cylinders 356a and 356b is not work or is malfunctioning, the second path selector 356c can detect the malfunction or abnormality and guides the source fluid SF to the other normal, working purifying cylinder. Thus, moisture can be substantially removed from the source fluid. SF irrespective of malfunctions of the dehydrating cylinders 356a and 356b, thereby preventing efficiency deterioration and reducing the maintenance cost of the second filter 356.

According to embodiments, each of the dehydrating cylinders 356a and 356b includes a dehumidifying agent, such as a desiccant, that can absorb moisture from the source fluid SF by chemical reactions or physical adsorptions. The dehydrating cylinders 356a and 356b are filled with the dehumidifying agents and an inlet pressure of each dehydrating cylinder 356a and 356h is set to be greater than an outlet pressure. Thus, the impurity-filtered source fluid SF flows through the hydrating cylinders 356a and 356b and moisture in the source fluid SF is removed by the dehumidifying agent in the dehydrating cylinders 356a and 356b.

Therefore, according to embodiments, moisture is substantially removed from the impurity-filtered source fluid SF by the second filter 356, and the source fluid SF flows into the SCF generator 200 with a sufficiently low concentration of moisture and organic impurities.

According to embodiments, the moisture detector 366 is connected to the second dehydrating line DHL2 and can detect the moisture concentration in the source fluid SF dehydrated by one of the first and the second dehydrating cylinders 356a and 356b. In a present exemplary embodiment, the moisture detector 366 includes a first moisture detector 366a connected to the first dehydrating cylinder 356a via the second dehydrating line DHL2 and a second moisture detector 366b connected to the second dehydrating cylinder 356b via the second dehydrating line DHL2.

According to embodiments, the first moisture detector 366a can detect moisture in the impurity-filtered source fluid SF discharged from the first dehydrating cylinder 356a and flowing through the second dehydrating line DHL2. Similarly, the second moisture detector 366b can detect moisture in the impurity-filtered source fluid SF discharged from the second dehydrating cylinder 356b and flowing through the second dehydrating line DHL2.

Thus, according to embodiments, the moisture detector 366 monitors dehydration performance of the first and the second dehydrating cylinders 356a and 356b by detecting and measuring moisture concentration in the dehydrated source fluid SF.

Figure 6:
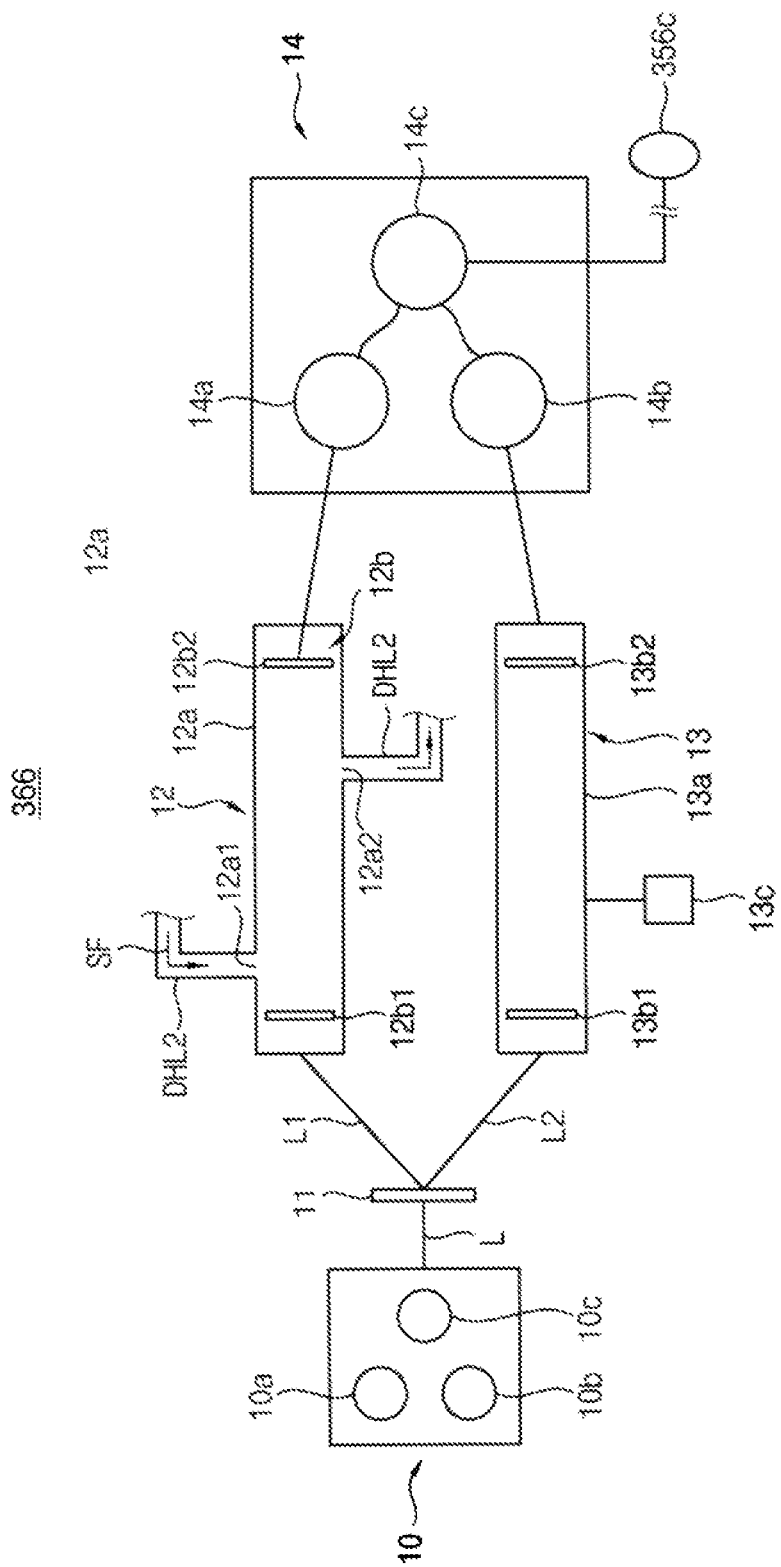
FIG. 6 is a structural view of the moisture detector shown in FIG. 5 in accordance with an exemplary embodiment of the present inventive concept.

FIG. 6 is a structural view of the moisture detector shown in FIG. 5 in accordance with an exemplary embodiment of the present inventive concept.

Referring to FIG. 6, according to embodiments, the moisture detector 366 includes a laser source 10 that generates a detection laser L, a beam splitter 11, a detection cell 12, a reference cell 13 and a concentration analyzer 14.

According to embodiments, the laser source 10 generates a continuous wave (CW) laser as the detection laser L for detecting moisture in the source fluid SF.

According to embodiments, the laser source 10 includes a function generator 10a that generates a periodic waveform voltage in response to a trigger signal, a modulating driver 10b that amplifies the waveform voltage and converts the waveform voltage into a modulated current with the same period as the periodic waveform voltage, and a laser oscillator 10c that is oscillated by the modulated current to emit the periodic CW laser beam that is modulated in accordance with the modulated current.

In some exemplary embodiments, the function generator 10a generates a voltage signal having a periodic waveform in response to a trigger signal received from a main controller as a start signal of the moisture detection. The voltage signal waveform modulates the CW laser to generate a waveform suitable for detecting moisture in the source fluid SF.

According to embodiments, the modulating driver 10b receives a periodic voltage signal from the function generator 10a and amplifies and modulates the voltage signal. Then, the modulated voltage signal is converted into a modulated current signal by the modulating driver 10b. For example, in some embodiments, the modulating driver 10b includes a laser diode driver (LDD).

According to embodiments, the laser oscillator 10c includes a resonator that is activated by the modulated current signal and continuously outputs a uniform intensity laser. Since the resonator is periodically activated by the modulated current signal, the laser beam is also output as a periodic waveform of the modulated current signal. Therefore, the laser oscillator 10c generates the periodic CW laser L having the same period as the modulated current signal.

According to embodiments, the CW laser L is divided into a first split laser L1 and a second split laser L2 by the beam splitter 11. The first split laser L1 irradiates the detection cell 12 and the second split laser L2 irradiates the reference cell 13.

According to embodiments, the detection cell 12 includes a cylindrical body 12a having a source inlet 12a1, a source outlet 12a2, and a pair of reflection mirrors 12b each positioned at either end portion of the cylindrical body 12a. The source inlet 12a1 of the cylindrical body 12a is connected to the second dehydrating line DHL2, so that in the moisture detection process, some of the dehydrated source fluids SF flows out of the second dehydrating line DHL2 and into the cylindrical body 12a through the source inlet 12a1. Then, the source fluid SF in the cylindrical body 12a flows out through the source outlet 12a2 and converges back into the second dehydrating line DHL2.

According to embodiments, a first reflection mirror 12b1 is positioned in the cylindrical body 12a adjacent to the beam splitter 11 that has about a 1.00% reflectivity. In contrast, a second reflection mirror 12b2 is positioned in the cylindrical body 12a adjacent to the concentration analyzer 14 opposite to the first reflection mirror 12b1 that has a smaller reflectivity than that of the first reflection mirror 12b1. Therefore, some of the first split laser L1 transmits through the second reflection mirror 12b2 while most of the first split laser L1 is reflected by the first reflection mirror 12b1. The transmitted portion of the first split laser L1 can be detected as an inspection signal by an inspection signal analyzer 14a of the concentration analyzer 14.

According to embodiments, the reference cell 13 includes a reference chamber 13a, a pair of reflection mirrors 13b1 and 13b2 arranged in the reference chamber 13a, and a modulator 13c that applies a modulating current to vary the wavelength of the second split laser L2. Third and fourth reflection mirrors 13b1 and 13b2 are arranged at either end portion of the reference chamber 13a so that the reflectivity of the fourth reflection mirror 13b2 is less than that of the third reflection mirror 13b1, similar to the configurations of the first and the second reflection mirrors 12b1 and 12b2 in the detection cell 12. Thus, some of the second split laser L2 transmitting through the fourth reflection mirror 13b2 can be detected as a reference signal by a reference signal analyzer 14b of the concentration analyzer 14. In particular, the reference signal can be detected with respect to every modulated second split laser L2, so the reference signal analyzer 14b can detect a plurality of second detection signals, each corresponding to one of a plurality of modulated second split lasers L2. A peak point P in FIG. 8 at which the CW laser absorbs the most moisture can be detected by analyzing the plurality of the second detection signals.

Figure 7:
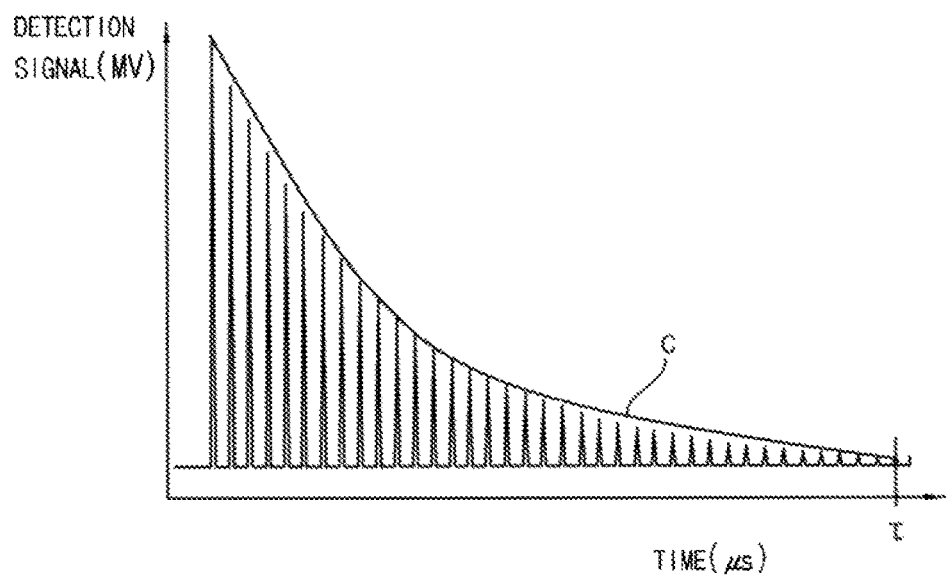
FIG. 7 is a graph of detection signals that are detected as a function of time in the moisture analyzer shown in FIG. 6.
Figure 8:
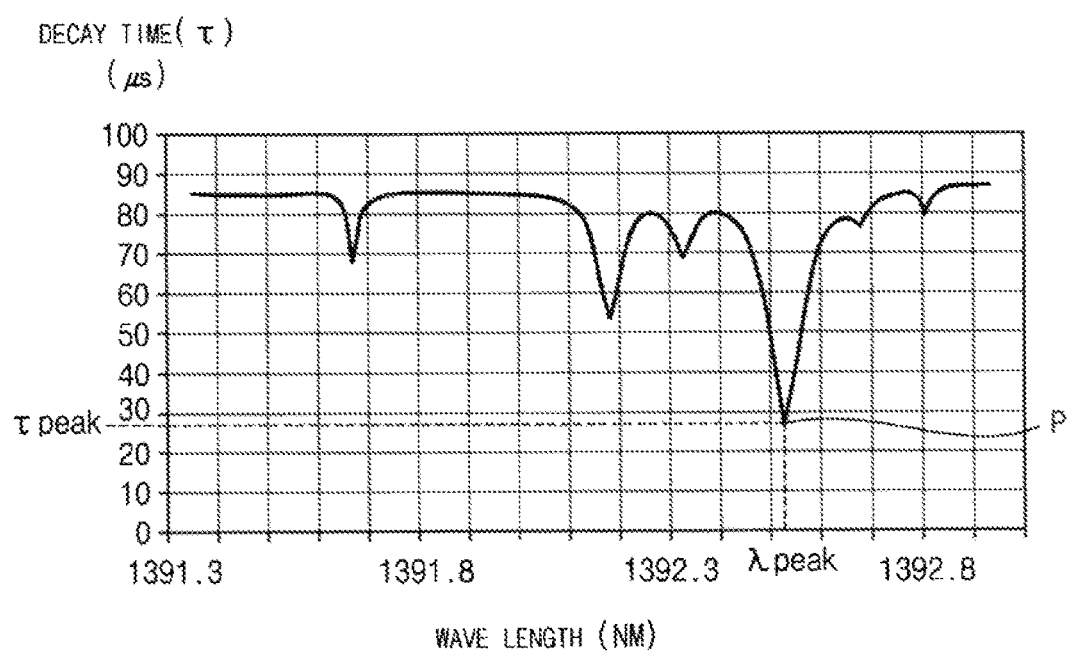
FIG. 8 is a graph of a relation between decay times of the detection signals and the wavelengths of the CW laser.

FIG. 7 is a graph of detection signals that are detected in the moisture analyzer shown in FIG. 6 as a function of time, and FIG. 8 is a graph of a relation between decay times of the detection signals and the wavelengths of the CW laser.

According to embodiments, as shown in FIG. 7, the first and the second detection signals gradually attenuate and finally decay as time goes by due to the reflectivity differences between the first and the second reflection mirrors 12b1 and 12b2 and between the third and the fourth reflection mirrors 13b1 and 13b2. In some exemplary embodiments, the detection signal detected by the first and the reference signal analyzers 14a and 14b attenuates or decays according to an exponential curve C. In such a signal operation mode, the decay time τ of the signal is defined as the time for the signal intensity to be attenuated to about 1% of an initial intensity. As the CW laser L is absorbed by moisture, the decay time τ decreases in proportion to the amount of moisture through which the CW laser L may pass.

According to embodiments, the reference signal analyzer 14b detects various second detection signals that correspond to the modulated second split laser L2, and decay times τ of each second detection signal can be individually detected by the reference signal analyzer 14b. In contrast, the inspection signal analyzer 14a detects an inspection signal corresponding to the first split laser L1 with a specific wavelength, and the decay time τ of the inspection signal.

According to embodiments, a plurality of the decay times τ can be obtained with respect to the wavelengths of the second split laser L2, and the reference signal analyzer 14b searches the graph shown in FIG. 8 for a peak point P having a peak wavelength $\lambda_{peak}$ and a peak decay time $\tau_{peak}$ at which the decay timer is a minimum.

According to embodiments, the reference signal is detected by the reference signal analyzer 14b for every modulated wavelength of the second split laser L2 and a plurality of the decay times τ are obtained with respect to the second detection signals, respectively. Since shorter decay timed indicate a greater absorption of the CW laser by moistures in the reference cell 13, each point of the curve in FIG. 8 indicates an absorption rate of the CW laser L for a particular wavelength. That is, the curve in FIG. 8 shows the moisture absorption characteristics of the CW laser L as a function of wavelength. Thus, the peak point P in FIG. 8 reveals the maximal absorption rate of the CW laser L from the peak wavelength $\lambda_{peak}$ and the corresponding peak decay time $\tau_{peak}$.

According to embodiments, when the peak point P is detected by the reference signal analyzer 14b, the CW laser L is modulated to have the peak wavelength $\lambda_{peak}$ by the laser source 10 and is then irradiated into the detection cell 12 after being split into the first split laser L1. Accordingly, the inspection signal analyzer 14a can detect a current decay time $\tau_c$ of the inspection signal that corresponds to the first split laser L1 having the peak wavelength $\lambda_{peak}$.

According to embodiments, since the moisture absorption of the first split laser S1 is varied based on the moisture concentration of the source fluid SF in the detection cell 12, the current decay time $\tau_c$ of the inspection signal is also varied based on the moisture concentration of the source fluid SF that is dehydrated by the first or the second dehydrating cylinder 356a or 356b.

According to embodiments, when the source fluid SF in the detection cell 12 has no moisture, the peak wavelength $\lambda_{peak}$ first split laser L1 is not absorbed by moisture in the detection cell 12 and the decay time τ increases above the current decay time $\tau_c$. In such a case, the decay time τ of the inspection signal is substantially the same as the reference decay time $\tau_{ref}$ of the reference signal when the reference chamber 13a is changed into a vacuum state and a peak wavelength $\lambda_{peak}$ second split laser L2 is irradiated into the reference cell 13.

According to embodiments, the current decay time $\tau_c$ of the inspection signal and the reference decay time $\tau_{ref}$ of the reference signal are transmitted to a concentration operator 14c and the moisture concentration of the source fluid SF is calculated by the following equation (1) according to the Beer-Lambert law.

$$N = k\left(\frac{1}{\tau_c} - \frac{1}{\tau_{ref}}\right), \quad (1)$$

where k is a proportionality constant and N is a moisture concentration of the source fluid SF.

Accordingly, according to embodiments, the moisture concentration of the dehydrated source fluid SF flowing through the second dehydrating line DHL 2 can be detected in real time.

According to embodiments, when the moisture concentration of the first dehydrating cylinder 356a rises above an allowable reference value, the second path selector 356c closes the first dehydrating line DHL1 and opens the second dehydrating line DHL2 such that the impurity-filtered source fluid SF flows into the second dehydrating cylinder 356b and is blocked from flowing into the first dehydrating cylinder 356a. The first dehydrating cylinder 356a can be repaired while the source fluid SF is dehydrated in the second dehydrating cylinder 356b.

According to the above filtering system FS according to an embodiment, the source fluid SF is dehydrated and filtered prior to being supplied to the SCF generator 200, thereby substantially reducing the moisture concentration in the supercritical fluid SCF. In particular, the moisture concentration of the source fluid SF can be detected and maintained below the reference value in real time, to accurately control the moisture concentration of the supercritical fluid SCF. Therefore, process defects of fine patterns such as leaning defects and bridge defects, can be minimized in a supercritical process.

In a present exemplary embodiment, the purifier 350 purifies a low purity source fluid SF of about 99.9% (3N) to about 99.95% (3.5N) into a high purity source fluid SF of about 99.999% (5N) and then removes moisture from the 5N-source fluid SF within an allowable moisture concentration. Thus, the impurity-filtered and dehydrated source fluid SF is supplied into the supercritical fluid generator 200.

While a present exemplary embodiment discloses that a single impurity assembly having the first filter 352 and the impurity detector 362 and a single moisture assembly having the second filter 356 and the moisture detector 366 are connected in series in the filtering system FS, a plurality of the impurity assemblies and a plurality of the moisture assemblies can be connected in series to improve the purity of the source fluid. In addition, a plurality of the impurity assemblies can be connected in parallel with one another and a plurality of the moisture assemblies can also be connected in parallel with one another, to increase the purifying performance of the filter system FS.

Figure 9:
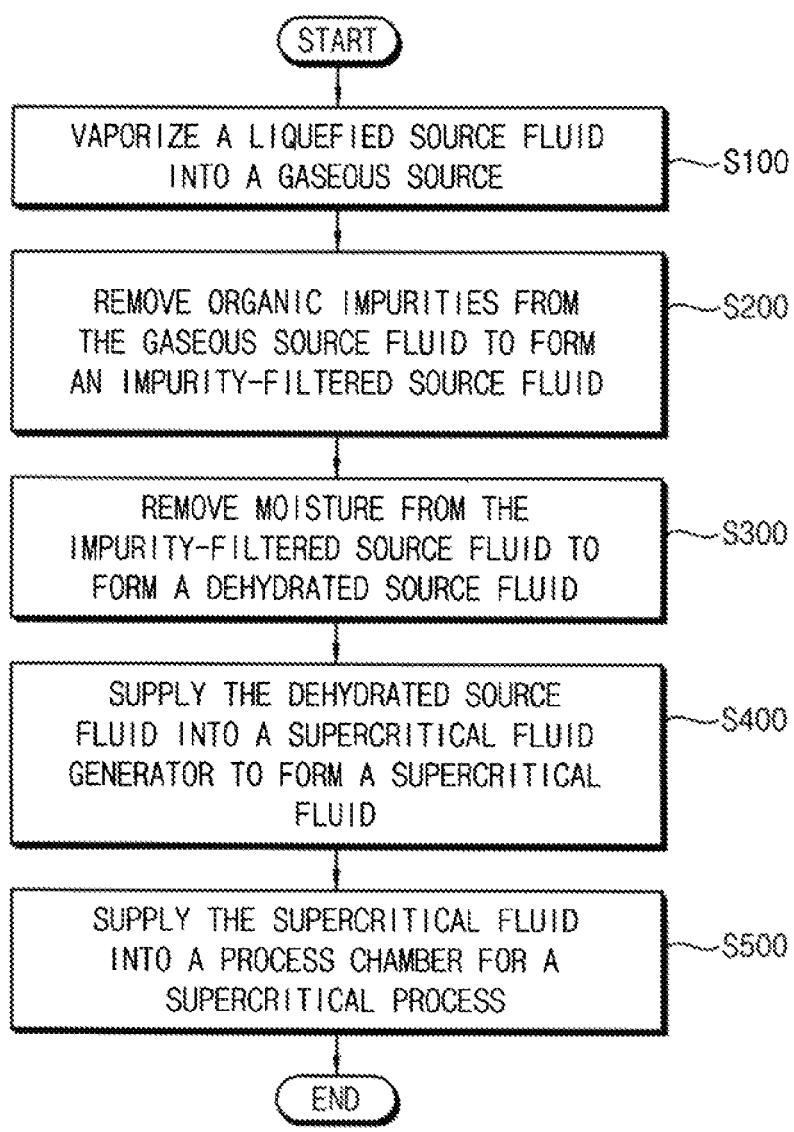
FIG. 9 is a flow chart of processing steps of a method of performing a supercritical process using a substrate processing apparatus as shown in FIG. 1.

FIG. 9 is a flow chart of processing steps of a method of performing a supercritical process using a substrate processing apparatus as shown in FIG. 1. While a present exemplary embodiment discloses a supercritical drying process as the supercritical process in FIG. 9, other semiconductor manufacturing processes, such as cleaning processes and rinsing processes, can be performed by present exemplary embodiments as long as the manufacturing process uses a supercritical fluid. In addition, a present exemplary embodiment can also be incorporated into manufacturing processes for flat panels as long as a plurality of fine patterns are formed on the panel using the supercritical process.

According to embodiments, a plurality of fine patterns are formed on a substrate by a series of deposition and patterning processes, and a cleaning and/or a rinsing process is performed on the substrate using various chemicals, thereby removing the byproducts and residuals of the deposition and patterning processes. After completing the cleaning and/or the rinsing process, a supercritical drying process is performed on the substrate using the supercritical fluid SCF to remove chemicals from the substrate prior to transferring the substrate to a next manufacturing process.

According to embodiments, when a supercritical drying process starts in response to a control signal, the liquefied source fluid SF is supplied to the vaporizer 330 from the source reservoir 310 by the transfer pump 320. Then, the liquefied source fluid SF is vaporized into the gaseous source fluid SF in the vaporizer 330 (step S100). For example, the liquefied source fluid SF contained in the source reservoir 310 under a pressure of about 15 bar to about 25 bar is changed into the gaseous source fluid SF under a pressure of about 30 bar to about 40 bar.

According to embodiments, the gaseous source fluid SF is supplied to the filtering system FS from the vaporizer 320 and then impurities and moisture are removed from the gaseous source fluid SF in the filtering system FS under the control of the flow controller 340. Thereafter, the impurity-filtered and dehydrated source fluid SF is supplied to the supercritical fluid SCF generator 200. The mass flow of the gaseous source fluid SF is controlled by the flow controller 340.

According to embodiments, impurities are filtered from the gaseous source fluid SF in the first filter 352, which has a pair of the purifying cylinders 352*a* and 352*b*, to form the impurity-filtered source fluid SF (step S200). In a present exemplary embodiment, each of the purifying cylinders 352*a* and 352*b* includes a HEPA filter and a carbon filter, so that organic impurities are substantially removed from the source fluid SF. Then, moisture is removed from the impurity-filtered source fluid SF in the second filter 356, which has a pair of dehydrating cylinders 356*a* and 356*b*, to form the dehydrating source fluid SF (step S300).

According to embodiments, when one of the first and the second purifying cylinder 352*a* and 352*b* does not work or has malfunctioned, the first path selector 352*c* detects the malfunction or abnormality and guides the source fluid SF to the other normal, working purifying cylinder. Similarly, when one of the first and the second dehydrating cylinder 356*a* and 356*b* does not work or has malfunctioned, the second path selector 356*c* detects the malfunction or abnormality and guides the source fluid SF to the other normal, working dehydrating cylinder.

Thus, according to embodiments, the impurities of the source fluid SF are substantially filtered from the source fluid SF irrespective of any malfunctions of the purifying cylinders 352*a* and 352*b*, thereby preventing efficiency deterioration and reducing the maintenance cost of the first filter 352. In addition, moisture in the source fluid SF can be substantially removed from the source fluid SF irrespective of any malfunctions of the dehydrating cylinders 356*a* and 356*b*, thereby preventing efficiency deterioration and reducing the maintenance cost of the second filter 356.

Thereafter, according to embodiments, the impurity-filtered and dehydrated source fluid SF is supplied into the supercritical fluid SCF generator 200, to form the supercritical fluid SCF (step S400). In a present exemplary embodiment, the supercritical fluid SCF includes supercritical carbon dioxide ($CO_2$).

Then, according to embodiments, the supercritical fluid SCF is supplied to the process chamber for a supercritical drying process (step S500). At first, the supercritical fluid SCF is supplied into the buffer spacer BS of the process chamber 100 through a lower hole LH, so the substrate is protected from direct injection of the high pressure and high temperature supercritical fluid. When the pressure gradient between the inner pressure of the process chamber 100 and the pressure of the supercritical fluid SCF is sufficiently small, the supercritical fluid SCF is supplied to the process chamber 100 through the upper hole UH without substantially collapsing the high aspect ratio patterns on the substrate.

According to embodiments, when the supercritical drying process is performed in the process chamber 100 and chemicals are dissolved into the supercritical fluid SCF, the supercritical mixtures of chemicals and the supercritical fluid SCF are discharged from the process chamber 100 through the discharge hole DH so that the inner pressure of the process chamber 100 gradually decreases to atmospheric pressure. The supercritical mixtures are gathered in the buffer space BS at first and are then discharged through the discharge hole DH.

According to embodiments, since the moisture concentration of the supercritical fluid SCF is substantially reduced in the supercritical drying process, damage to fine patterns caused by moisture in the supercritical fluid SCF is substantially prevented when performing a drying process.

According to exemplary embodiments of a source supplier and a substrate processing apparatus, moisture as well as organic impurities can be removed from the gaseous source fluid to substantially reduce the moisture concentration of the supercritical fluid in the supercritical process. Thus, process defects such as leaning defects and bridge defects can be prevented in a supercritical process.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the present invention. Therefore, it is to be understood that the foregoing is illustrative of various exemplary embodiments and is not to be construed as limited to the specific exemplary embodiments disclosed, and that modifications to disclosed exemplary embodiments, as well as other exemplary embodiments, are intended to be included within the scope of the appended claims.

What is claimed is:

1. An apparatus for processing substrates using a supercritical fluid (SCF) as a process fluid, comprising:
    a process chamber that performs a supercritical process on the substrate using the SCF;
    a SCF generator that generates the SCF and supplies the SCF to the process chamber; and
    a source supplier that supplies a source fluid to the SCF generator,
    wherein the source supplier includes:
        a source reservoir that contains a liquefied source fluid;
        a vaporizer that vaporizes the liquefied source fluid into a gaseous source fluid under high pressure;
        a purifier that removes organic impurities and moisture from the gaseous source fluid; and
        an analyzer connected to the purifier that analyzes an impurity fraction and a moisture fraction in the gaseous source fluid, wherein the analyzer includes an impurity detector that detects organic impurities in the gaseous source fluid and a moisture detector that detects moisture in the gaseous source fluid.

2. The apparatus of claim 1, wherein the process chamber includes an upper chamber having a substrate holder, a lower chamber having a blocking plate and a buffer space between the blocking plate and a lower portion thereof, and a chamber driver that combines the upper chamber and the lower chamber wherein insides of the upper chamber and the lower chamber forms a sealed inner space of the process chamber.

3. The apparatus of claim 2, wherein the process chamber includes an upper hole in an upper portion of the upper chamber that is connected to the SCF generator, a lower hole in a lower portion of the lower chamber that is connected to the SCF generator, and a discharge hole through which supercritical mixtures that are byproducts of the supercritical process are discharged from the process chamber.

4. The apparatus of claim 1, wherein the purifier includes:
a first filter that filters the organic impurities from the gaseous source fluid, wherein an impurity-filtered source fluid is formed; and
a second filter that filters moisture from the impurity-filtered source fluid, wherein a dehydrated source fluid is formed.

5. The apparatus of claim 4, wherein the moisture detector includes:
a laser source that generates a continuous wave (CW) laser;
a beam splitter that divides the CW laser into a first split laser and a second split laser;
a detection cell through which the dehydrated source fluid flows and into which the first split laser is irradiated;
a reference cell that contains a gaseous sample fluid in which some moisture is included at a reference concentration and into which the second split laser is irradiated; and
a concentration analyzer that detects the moisture fraction and calculates a moisture concentration in the dehydrated source fluid from a following equation (1):

$$N = k\left(\frac{1}{\tau_c} - \frac{1}{\tau_{ref}}\right) \quad (1)$$

wherein, N is a moisture concentration of the dehydrated source fluid, k is a proportionality constant, $\tau_c$ is a current decay time of an inspection signal when the first split laser is modulated to have a peak wavelength at which the CW laser is maximally absorbed by the moisture and $\tau_{ref}$ is a reference decay time of a reference signal when the reference cell is in a vacuum state without any moistures and the second split laser is modulated to have the peak wavelength.

6. The apparatus of claim 5, wherein the detection cell includes a detection body and a pair of reflection mirrors wherein each is positioned at one end portion of the detection body and each has a different reflectivity, and the reference cell includes a reference chamber, a pair of reflection mirrors each of which is positioned at one end portion of the reference chamber, and a modulator that changes a wavelength of the second split laser.

7. The apparatus of claim 5, wherein the concentration analyzer includes:
a reference signal analyzer that detects the reference signals corresponding to the second split lasers being transmitted through the reference cell with different wavelengths and obtains a peak point of a peak wavelength at which the CW laser is most absorbed by moisture;
an inspection signal analyzer that detects the inspection signal corresponding to the first split laser being transmitted through the detection cell with the peak wavelength and obtains the current decay time $\tau_c$ at which a signal intensity is attenuated to a 1% of an initial intensity; and
a concentration operator that stores the reference decay time $\tau_{ref}$ and performs the calculation according to equation (1).

8. The apparatus of claim 4, wherein the first filter includes a high-efficiency particulate arrestance (HEPA) filter and a carbon filter combined into one structure and the second filter includes a dehumidifying agent.

9. The apparatus of claim 1, wherein the liquefied source fluid includes a liquefied carbon dioxide ($CO_2$) at a pressure of 15 bar to 25 bar and the gaseous source fluid includes a gaseous $CO_2$ at a pressure of 30 bar to 40 bar.

10. The apparatus of claim 1, further comprising a flow controller connected to the vaporizer that controls a mass flow of the gaseous source fluid; and
a buffer reservoir interposed between the vaporizer and the flow controller that temporarily stores the gaseous source fluid under an increased pressure.

11. An apparatus for processing substrates using a supercritical fluid (SCF) as a process fluid, comprising:
a process chamber that performs a supercritical process on the substrate using the SCF;
a SCF generator that generates the SCF and supplies the SCF to the process chamber; and
a source supplier that supplies a source fluid to the SCF generator,
wherein the source supplier includes:
a purifier that removes organic impurities and moisture from a gaseous source fluid, wherein the purifier includes a first filter that filters the organic impurities from the gaseous source fluid, wherein an impurity-filtered source fluid is formed, and a second filter that filters moisture from the impurity-filtered source fluid, wherein a dehydrated source fluid is formed; and
an analyzer connected to the purifier that analyzes an impurity fraction and a moisture fraction in the gaseous source fluid, wherein the analyzer includes an impurity detector that detects organic impurities in the impurity-filtered source fluid and a moisture detector that detects moisture in the dehydrated source fluid.

12. The apparatus of claim 11, wherein the source supplier further comprises:
a source reservoir that contains a liquefied source fluid for a supercritical process; and
a vaporizer that vaporizes the liquefied source fluid into the gaseous source fluid under high pressure.

13. The apparatus of claim 11, wherein the moisture detector includes:
a laser source that generates a continuous wave (CW) laser;
a beam splitter that divides the CW laser into a first split laser and a second split laser;
a detection cell through which the dehydrated source fluid flows and into which the first split laser is irradiated;
a reference cell that contains a gaseous sample fluid in which some moisture is included at a reference concentration and into which the second split laser is irradiated; and
a concentration analyzer that detects the moisture fraction and calculates a moisture concentration in the dehydrated source fluid from a following equation (1):

$$N = k\left(\frac{1}{\tau_c} - \frac{1}{\tau_{ref}}\right) \quad (1)$$

wherein, N is a moisture concentration of the dehydrated source fluid, k is a proportionality constant, $\tau_c$ is a current decay time of an inspection signal when the first split laser is modulated to have a peak wavelength at which the CW laser is maximally absorbed by the moisture, and $\tau_{ref}$ is a reference decay time of a reference signal when the reference cell is in a vacuum state without any moisture and the second split laser is modulated to have the peak wavelength.

14. The apparatus of claim 13, wherein the detection cell includes a detection body and a pair of reflection mirrors wherein each is positioned at one end portion of the detection body and each has a different reflectivity, and the reference cell includes a reference chamber, a pair of reflection mirrors each of which is positioned at one end portion of the reference chamber, and a modulator that changes a wavelength of the second split laser, and wherein the concentration analyzer includes a reference signal analyzer that detects the reference signals corresponding to the second split lasers being transmitted through the reference cell with different wavelengths and obtains a peak point of a peak wavelength at which the CW laser is most absorbed by moisture; an inspection signal analyzer that detects the inspection signal corresponding to the first split laser being transmitted through the detection cell with the peak wavelength and obtains the current decay time $\tau_c$ at which a signal intensity is attenuated to a 1% of an initial intensity; and a concentration operator that stores the reference decay time $\tau_{ref}$ and performs the calculation according to equation (1).

15. The apparatus of claim 11, wherein the first filter includes a high-efficiency particulate arrestance (HEPA) filter and a carbon filter combined into one structure and the second filter includes a dehumidifying agent.

16. The apparatus of claim 12, wherein the liquefied source fluid includes a liquefied carbon dioxide ($CO_2$) at a pressure of 15 bar to 25 bar and the gaseous source fluid includes a gaseous $CO_2$ at a pressure of 30 bar to 40 bar.

17. The apparatus of claim 12, further comprising a flow controller connected to the vaporizer that controls a mass flow of the gaseous source fluid; and a buffer reservoir interposed between the vaporizer and the flow controller that temporarily stores the gaseous source fluid under an increased pressure.

* * * * *